United States Patent [19]

Blackstone

[11] Patent Number: 5,098,861

[45] Date of Patent: Mar. 24, 1992

[54] METHOD OF PROCESSING A SEMICONDUCTOR SUBSTRATE INCLUDING SILICIDE BONDING

[75] Inventor: Scott C. Blackstone, Mesa, Ariz.

[73] Assignee: Unitrode Corporation, Billerica, Mass.

[21] Appl. No.: 638,833

[22] Filed: Jan. 8, 1991

[51] Int. Cl.⁵ ............................................. H01L 21/22
[52] U.S. Cl. ...................................... 437/200; 437/61; 437/974; 437/154; 748/DIG. 12; 748/DIG. 147; 148/33.3; 148/33.4
[58] Field of Search ................. 437/200, 61, 974, 154; 148/DIG. 147, 33, 33.1, 33.3, DIG. 12; 357/71, 55; 228/179

[56] References Cited

U.S. PATENT DOCUMENTS 3,333,324  8/1987  Roswell et al. ...................... 228/179
4,794,445  12/1988  Homma et al. ....................... 357/71
4,826,787  5/1989  Muto et al. ............................ 437/208

OTHER PUBLICATIONS

Ghandhi, S. K., VLSI Fabrication Principles, John Wiley & Sons, 1983, pp. 426-429.

Primary Examiner—Brian E. Hearn
Assistant Examiner—T. N. Quach
Attorney, Agent, or Firm—Weingarten, Schurgin, Gagnebin & Hayes

[57] ABSTRACT

A method for processing at least two semiconductor wafers for producing a partially processed semiconductor substrate which can be subsequently further processed utilizing conventional planar semiconductor processing techniques to achieve a complementary semiconductor structure in which a plurality of matched semiconductor elements can be formed. An embedded silicide layer in the bonded semiconductor substrate acts as a conduit for horizontally dispersing dopant during the diffusion process. The dopant subsequently up-diffuses into an adjacent silicon region forming generally uniform and shallow, buried layer regions.

8 Claims, 5 Drawing Sheets

METHOD OF PROCESSING A SEMICONDUCTOR SUBSTRATE INCLUDING SILICIDE BONDING

FIELD OF THE INVENTION

This invention relates to semiconductor devices and more particularly, to a method of processing at least two semiconductor wafers to produce a partially processed semiconductor substrate.

BACKGROUND OF THE INVENTION

Many situations arise in which it would be advantageous for semiconductor vendors to provide for complementary semiconductor devices on one substrate or chip. Examples of complementary devices include a plurality of common anode diodes on the same substrate as a group of common cathode diodes; or a vertical NPN transistor adjacent a vertical PNP transistor. In the case of the diodes, one chip replaces two chips, whereas in the case of the transistors, a lower performance lateral PNP transistor could be replaced by a vertical PNP transistor provided along side a vertical NPN transistor.

Although providing a complementary substrate has may advantages, the manufacturing process has many difficulties and involves special fabrication techniques which have prevented wide spread manufacture and use of such devices except in specialized applications.

An ideal complementary semiconductor substrate is shown in prior art FIG. 1 and includes a plurality of regions 10,12 separated by a vertical dielectric region 14. Each dielectrically isolated region includes a lightly doped N region 16 or P region 18. In addition to the likely doped regions, the idealized complementary semiconductor substrate also includes a heavily doped horizontal buried layer 20,22 underlying the lightly doped regions, and a vertical heavily doped sinker diffusion 24,26 by which contact to the buried layer is achieved.

Since most applications for a complementary semiconductor substrate require that the semiconductor devices be matched, the thickness X and Y indicated by arrows 28 and 30 respectively should be as equal as possible.

The fabrication of the ideal complementary semiconductor substrate shown in FIG. 1 is illustrated in FIGS. 2A–2C and begins with a Silicon On Insulator (SOI) wafer 40 comprising a silicon layer 42 approximately two to twenty microns thick on an oxide layer 44, which in turn is disposed on a substrate 46. Silicon layer 42 is then heavily doped N+ or P+, as required, to create buried layers 48 and 50 of the finished substrate.

An epitaxial layer 52, FIG. 2B, is then grown over silicon layer 42. Epitaxial layer 52 is then lightly doped N− and P−, 54 and 56 respectively, by selective diffusion. The diffusion of the N− and P− regions requires long time periods at high temperatures because the diffusion process is driven by differential doping gradients which are weak within the lightly doped layer. As a result of the high temperature long diffusion time period, the heavily doped buried layer 42 will also outdiffuse upwardly into the lightly doped layer 52 thus typically reducing the thickness of the lightly doped layer 52. Although the up-diffusion can usually be compensated for by starting with a thicker epitaxial layer 52, the P+ buried layer 50 will generally up-diffuse faster than the N+ buried region 48 due to the nature of the dopants used for buried layer formation.

After completing the N+ and P+ sinker diffusions 58 and 60, FIG. 2C, the structure is complete. Because of the faster up-diffusion of the P+ buried layer, however, the lightly doped layer thickness X illustrated by arrow 62 will be substantially thicker than the lightly doped layer thickness Y illustrated by arrow 64. The resulting semiconductor devices are thus not the "ideal" matched semiconductor devices as shown in FIG. 1 but rather a compromise structure with a corresponding compromise in device performance. Additionally, this inherent problem is a result of the traditional manufacturing technique that requires that the lightly doped N− and P− diffusions be performed after the heavily doped buried layer diffusions.

One method of eliminating the inherent problem of variations in doped layer thickness within a substrate as discussed above is to utilize wafer bonding technology. Two silicon wafers may be bonded together to produce a silicon substrate with particular characteristics as discussed in related U.S. patent application No. 202,112, now abandoned entitled "Wafer Bonding Using Low Temperature Neutral Alloys" and related U.S. patent application No. 295,045 now U.S. Pat. No. 5,004,705 entitled "Inverted Epitaxial Process", both of which are incorporated herein by reference.

As previously disclosed, this technique begins with a lightly doped silicon wafer 70, FIG. 3 which is similar in resistivity to the epitaxial layer discussed in conjunction with FIGS. 2A–2C. N− and P− diffusions 72,74, respectively, are then performed on the wafer to an appropriate depth. Subsequently, N+ and P+ sinker diffusions 76,78, FIG. 3B are performed into the N− and P− diffusions.

After the high temperature diffusions 72–78 have been performed, the N+ and P+ buried layers 80,82, FIG. 3C are then performed last. Utilizing this method, the N+ and P+ diffusions 80,82 can be both shallow and of equal depth, insuring that the N− and P− regions 72,74 are of equal thickness as required for the complementary substrate.

After performing the buried layer diffusions, wafer 70, FIG. 3D, is bonded along surface 84 to a handle wafer 86 comprised of substrate 88 having an oxidized layer 90. Dielectric isolation regions 92–96, FIG. 3E, are then formed. Utilizing this technique, the final thickness of both the N− and P− regions 72,74 can be identical.

One drawback of this technique is that wafer 70, FIG. 3A, becomes "customized" immediately upon the first doping and diffusion steps 72–74 shown in FIG. 3A. Accordingly, the prior art lacks a method for processing one or more semiconductor wafers to provide a semiconductor substrate that is "generic" or partially processed utilizing more sophisticated semiconductor processing techniques, while allowing the partially processed substrate to be subsequently further processed and finished utilizing conventional semiconductor planar processing techniques, thus insuring that the substrate will provide matched semiconductor elements or devices of equal thickness.

SUMMARY OF THE INVENTION

This invention features a method for processing at least two semiconductor wafers for producing a partially processed, semiconductor substrate which can be subsequently further processed utilizing conventional planar semiconductor processing techniques to achieve a complementary semiconductor structure in which a plurality of matched semiconductor elements can be formed.

The method includes forming a metal silicide layer on at least a portion of at least one generally planar surface of a first semiconductor wafer. Subsequently, the metal silicide layer is bonded to a second semiconductor wafer thus forming a partially processed and bonded semiconductor substrate capable of being further processed to define one or more vertical semiconductor elements. The metal silicide layer disposed internally to the bonded semiconductor substrate enables conventional semiconductor planar fabrication technology to form a buried layer in the first semiconductor wafer which is shallow, and of uniform thickness.

Further processing of the bonded semiconductor substrate includes at least the steps of introducing an impurity substance into the first semiconductor wafer and diffusing the impurity substance vertically through the first semiconductor wafer into the metal silicide layer embedded within the bonded semiconductor substrate. The impurity substance is then laterally diffused into at least a portion of the embedded metal silicide layer and subsequently vertically up-diffused from the metal silicide layer into a region of the first semiconductor wafer adjacent the portion of the embedded metal silicide layer into which has been laterally diffused the impurity substance.

Further processing may also include forming electrical isolation regions through both the first semiconductor wafer and the embedded metal silicide layer for forming a plurality of electrically isolated semiconductor element regions. Additional impurities may also be diffused into the semiconductor element regions disposed on the first semiconductor wafer for forming the semiconductor elements.

DESCRIPTION OF THE DRAWINGS

These, and other features of the present invention will be better understood by reading the following detailed description taken together with the drawings, wherein.

DETAILED DESCRIPTION OF THE INVENTION

The method of the present invention provides a partially processed, "generic", complementary semiconductor substrate including an embedded silicide layer to facilitate further processing of the substrate for forming vertical, matched semiconductor elements utilizing conventional planar processing techniques.

Figure 1:
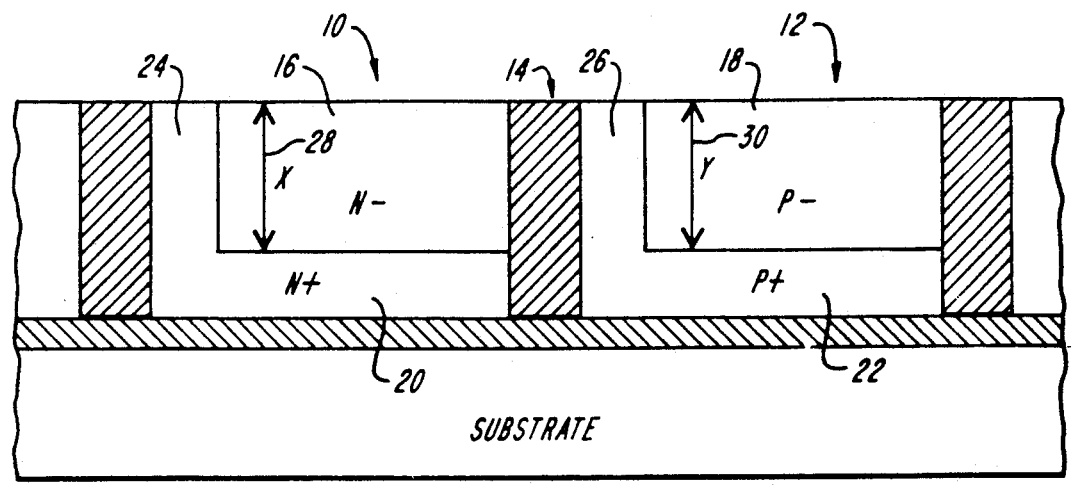
FIG. 1 is a cross-section of an ideal complementary semiconductor substrate as known in the prior art.
Figure 2A:
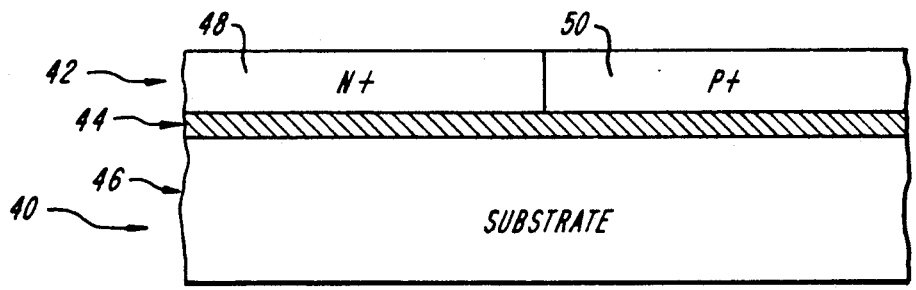
FIGS. 2A-2C are vertical cross-sections of a semiconductor substrate illustrating the inherent problems in fabricating an ideal complementary semiconductor substrate according to conventional, prior art, planar processes.
Figure 2B:
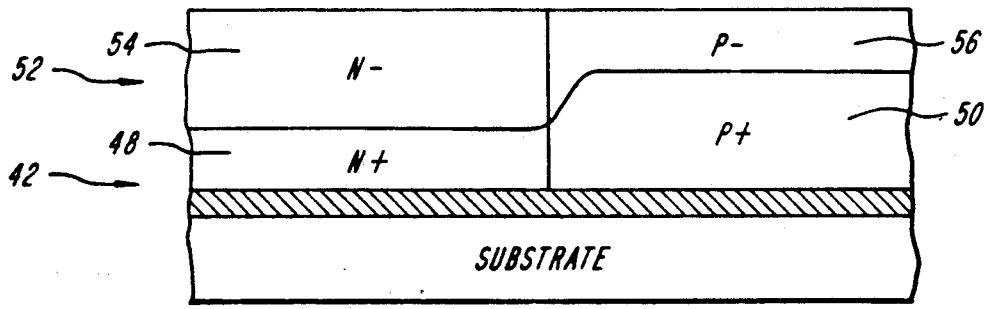
Figure 2C:
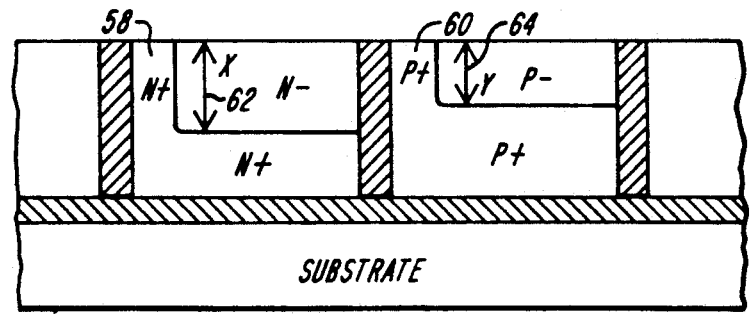
Figure 3A:
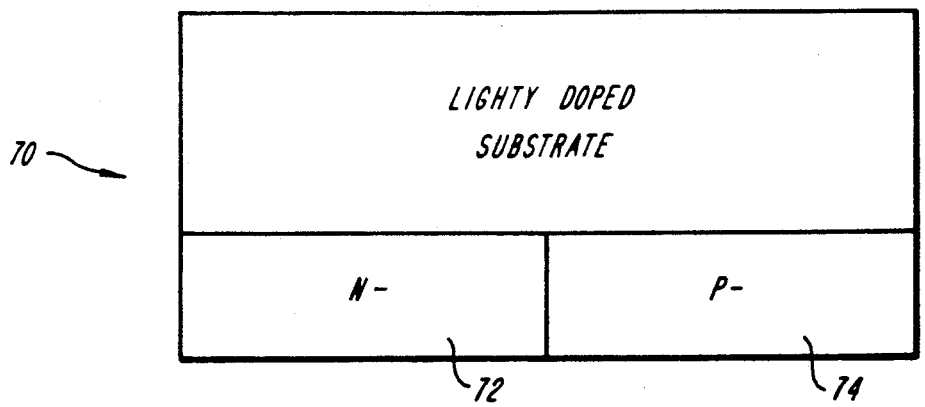
FIGS. 3A-3E are vertical cross-sections of a finished complementary bonded semiconductor substrate as may be accomplished according to the methods of the prior art.
Figure 3B:
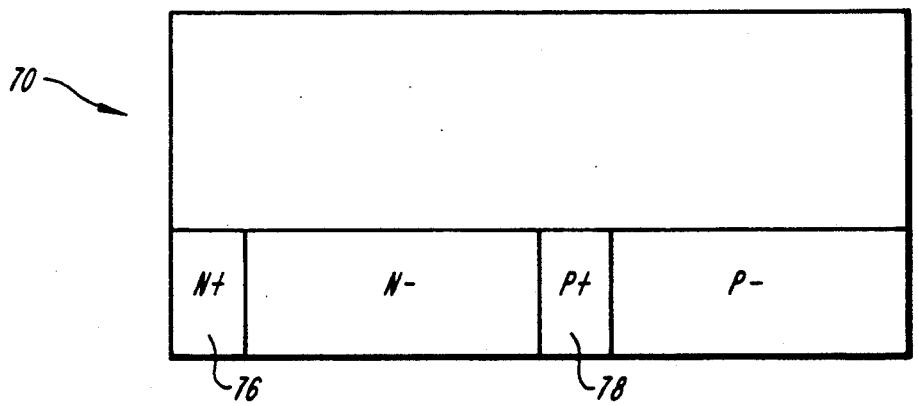
Figure 3C:
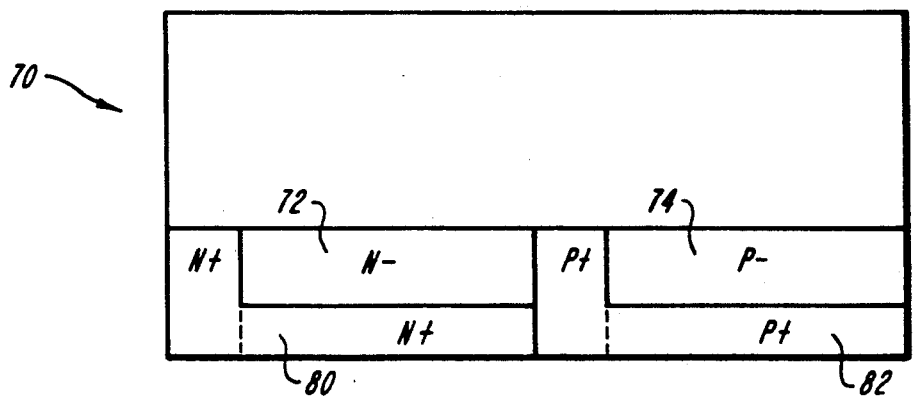
Figure 3D:
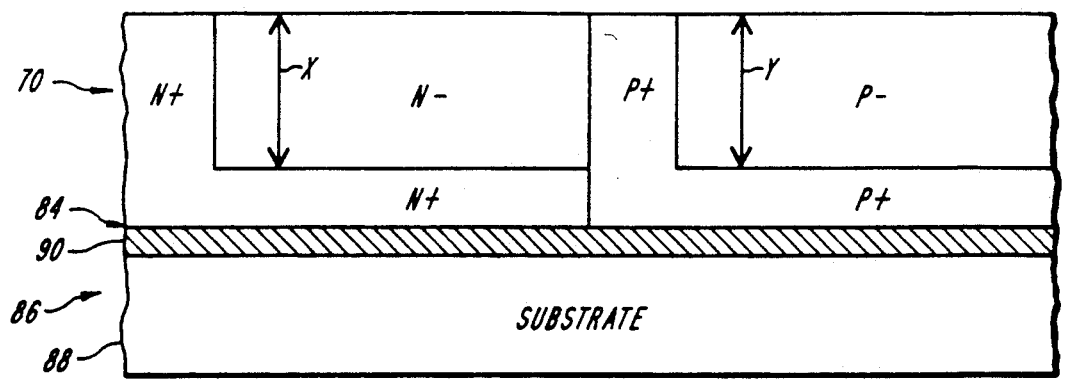
Figure 3E:
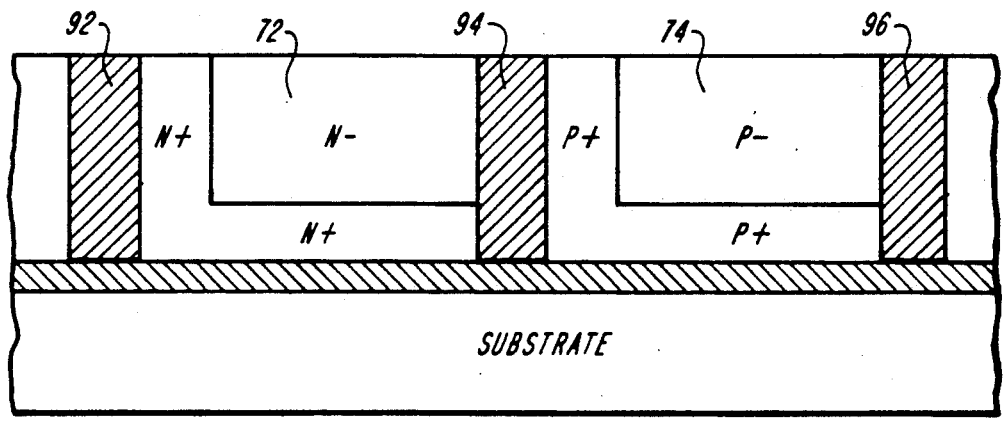
Figure 4A:
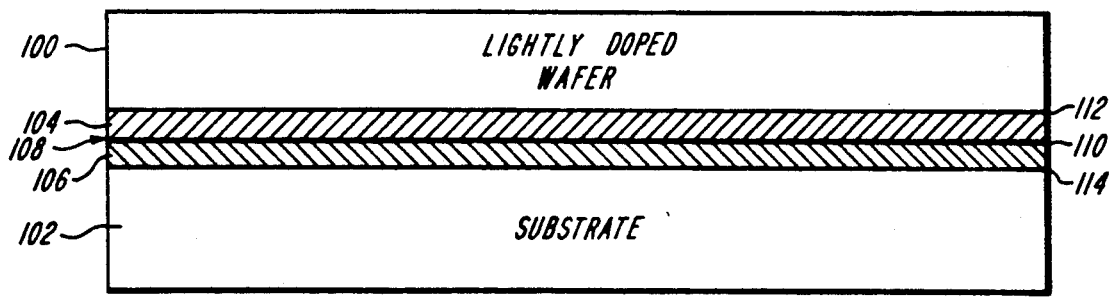
FIGS. 4A-4D are vertical cross-sections of the complementary, bonded semiconductor substrate fabricated according to the method of the present invention.

The process of the present invention produces the bonded, complementary semiconductor substrate shown in FIG. 4A which includes a lightly doped wafer portion 100, a substrate handle 102, and an embedded silicide layer 104 adjacent an oxidized layer 106. In one embodiment, silicide layer 104 is tungsten silicide of typically 0.3 microns thickness formed on one major planar surface of a lightly doped semiconductor wafer 100 by the process of chemical vapor deposition. Other silicides such as molybdenum, tantalum and titanium may also be utilized. In this same embodiment, the semiconductor handle 102 includes the oxidized layer 106 and the bond is formed generally in region 108 between the silicide layer 104 and the oxidized layer 106 without any intervening layer. In an alternative embodiment, a thin silicon layer 110 such as silicon dioxide or silicon nitride may be provided between silicide layer 104 and oxidized layer 106 to enhance or improve the bonding process.

In yet alternative embodiments, silicide layer 104 may be formed directly on oxidized layer 106 which in turn is formed on semiconductor handle 102 with the bonding occurring in region 112. Similarly, a further alternative embodiment is envisioned wherein silicide layer 104 is formed on the lightly doped semiconductor layer 100 while oxidized layer 106 is formed directly on silicide layer 104 with the bonding occurring generally in region 114. Accordingly, the bonded, complementary semiconductor substrate of FIG. 4A provides a truly "generic" partially processed semiconductor substrate utilizing less traditional, more complex fabrication techniques such as wafer bonding and silicide layer formation. The semiconductor substrate can than be further processed according to individual manufacturer's needs.

Figure 4B:
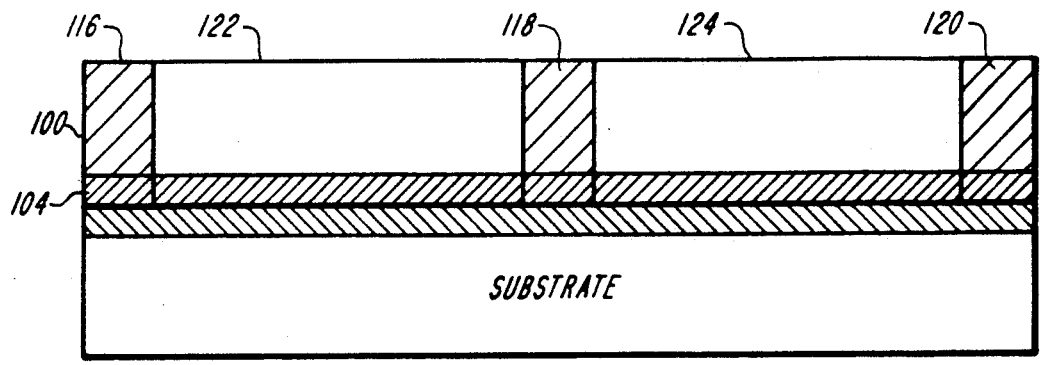

In the preferred embodiment, such further processing includes thinning wafer 100, FIG. 4B, to the desired thickness utilizing conventional wafer thinning technology. The partially processed and thinned semiconductor wafer can then be sold to a "conventional" semiconductor manufacturer who will complete the semiconductor fabrication process utilizing traditional planar semiconductor fabrication techniques. In an alternative embodiment, an epitaxial silicon layer could be grown on the wafer after thinning. After thinning semiconductor wafer 100, dielectric isolation regions 116-120 are formed. These regions extend through both the thin single crystal wafer 100 as well as the silicide layer 104. The dielectric isolation regions 116-120 separate wafer 100 into lightly doped silicon islands or regions 122,124 with each of the silicon islands including a layer of silicide disposed horizontally along the bottom most portion of the island.

Figure 4C:
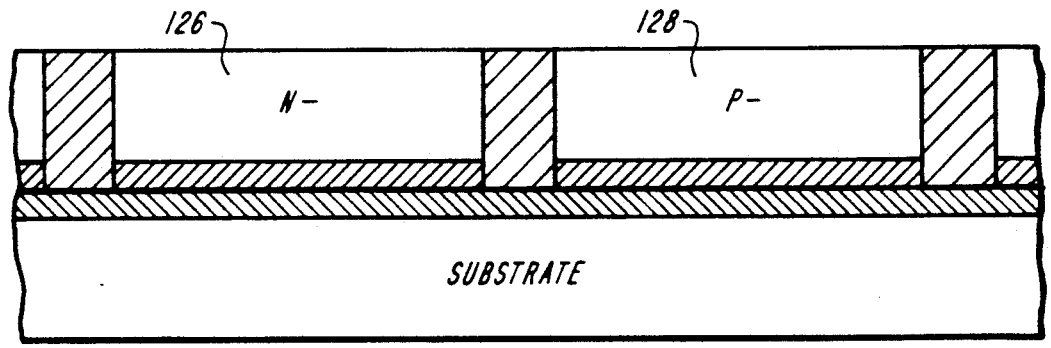

After the dielectric isolation regions are formed, N— or P— regions 126,128, FIG. 4C, are formed. This is accomplished utilizing conventional high temperature, long time period diffusions without interfering with any portion of the semiconductor substrate. Since the silicide layer is inert, it will not dope or in any way react with the doped single crystal regions 126,128 above it. Additionally, the silicide layer will always maintain a low electrical resistance. Although in this embodiment the dielectric isolation regions are formed before the N— and P— diffusion regions to laterally contain the diffusions and to achieve the best alignment between the diffusions and the dielectric isolation regions, the dielectric isolation regions may be formed after the N— and P— diffusions or later in the processing of the semiconductor substrate.

One feature of the present invention is that the buried layers of the semiconductor elements which are being formed are performed last. The buried layer diffusion step utilizes the high diffusion distance ratio of the silicide layer to horizontally or laterally carry the dopant as described herein.

Figure 4D:
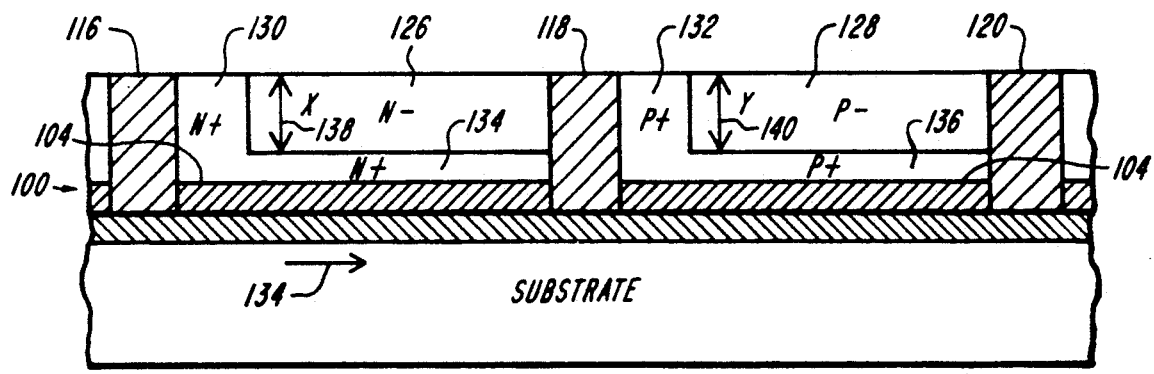

Thus, the final step in the semiconductor manufacturing process is to form the buried layers via the heavily doped N+ or P+ sinker diffusions 130,132, FIG. 4D. During the diffusion process, the sinker diffusions reach silicide layer 104 and quickly diffuse horizontally along the layer in the direction of arrow 134 away from the dielectric isolation regions 116,118. Silicide layer 104 becomes saturated with the dopant. Generally, dopants such as phosphorous and boron diffuse through the silicide layer considerably faster than they diffuse through a single crystal silicon layer. For example, diffusion distance ratios between silicide and single crystal silicon of more than 200:1 have been achieved at 1000° C. using POCl3, an N— type diffusion source, with similar results achieved for boron, a P— type diffusion source.

After saturating the silicide layer 104, the dopant then begins to up-diffuse into regions 126,128 forming buried layer regions 134,136. Thus, since the buried layers are formed last, the up-diffusion can be controlled and the buried layers 134,136 kept shallow. The resistivity of the up-diffused portions of buried layers 134,136 is unimportant because the silicide layer will short out the up-diffused regions 134,136 to the sinker diffusions 130,132. It is only important that the up-diffused buried layers 134,136 provide a low contact resistance between silicide layer 104 and the single crystal silicon 126,128. Additionally, the up-diffused buried layer regions 134,136 need only provide enough doping to contain any depletion regions from the single crystal silicon regions 126,128 that might extend downward into the up-diffused buried layers 134,136.

Typically, the up-diffused buried layers 134,136 are generally uniform in shape and generally shallow with respect to doped regions 126,128. Even if the up-diffused buried layer regions 134,136 are thicker near the sinker diffusions 130,132, it is important to note that both the N and P type buried layers 134,136 will have the same up-diffusion and thus the thickness of the N— and P— layers indicated by arrows X and Y 138,140 will be generally identical. It is also important to note that the buried layers 134,136 will be shallower than conventionally processed buried layers. For example, prior art buried layers are generally 10 microns thick, whereas the up-diffused buried layers of the present invention are typically 2 microns in thickness. Accordingly, a thinner silicon layer 100 may be provided which in turn facilitates the formation of the vertical dielectric isolation regions 116–120 since the throughput of the dielectric isolation forming process is a function of the depth that the isolation must reach.

To achieve more uniform buried up-diffusion regions, the final sequence of N+ and P+ sinker diffusions according to yet another embodiment of the present invention may include a series of low and high temperature cycles. For example, the sequence can begin with a high temperature cycle of approximately 1200° C. for approximately 100 minutes. Once the diffusions reach the silicide layer 104, the temperature may be dropped to approximately 900° C. so that single crystal doping is minimal and all diffusion will take place in the silicide layer, thus horizontally saturating the silicide layer. The silicide saturation process typically requires approximately 30 minutes. After the silicide layer has been saturated with dopant, the temperature may then be increased causing the dopant to up-diffuse into the single crystal silicon layers 126,128. This high-low temperature cycling can be repeated several times to prevent depletion of the silicide as a dopant source. Additionally, the temperature cycling technique will also smooth out the depth of the buried layer diffusions.

Figure 5:
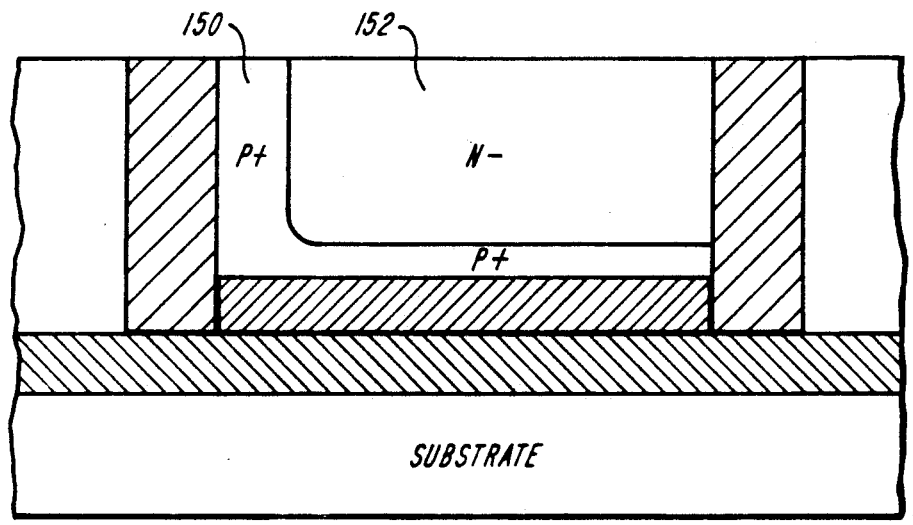
FIG. 5 is a vertical cross-section of an alternative semiconductor element formed in the complementary, bonded semiconductor substrate of the present invention.

It is important to note that the method of the present invention may also be utilized to form the semiconductor elements which are of a single polarity, such as all N— wells or all P— wells, as well as to diffuse a P+ buried layer and buried layer contact region 150, FIG. 5 into an N— well 152, or vice versa. Such a structure would be useful in the formation of a four layer semiconductor element such as an IGBT or an SCR.

Figure 6:
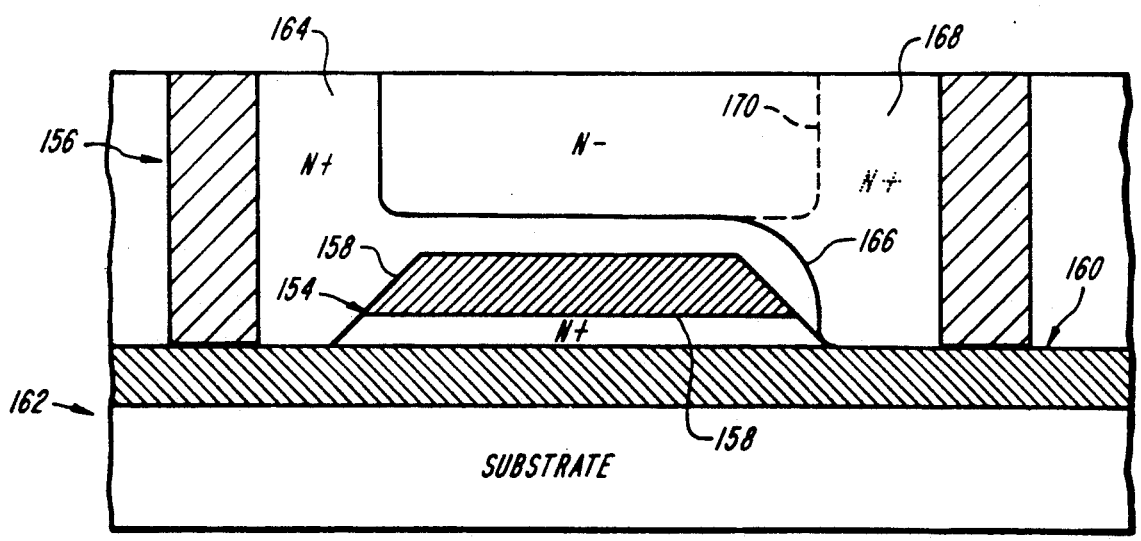
FIG. 6 is a vertical cross-section of an alternative embodiment of the bonded, complementary semiconductor substrate according to the present invention illustrating the embedded metal silicide layer formed in a void or pocket.

In a further alternative embodiment of the present invention, it may not be desired or it may not be possible to bond a particular metal silicide, in which case the structure shown in FIG. 6 could be provided by first forming a pocket or recess 154 in silicon layer 156. Silicide 158 is then deposited into the recess 154. The top of the silicide layer 158 may be recessed or co-planar with the surface 160 of silicon wafer 156. It is also envisioned that any gap between the top of the silicide layer 158 and the planar surface 160 of silicon wafer 156 may be filled with a material such as polycrystalline silicon. Filling in the gap between the silicide layer and the planar surface of the silicon wafer would decrease thermal resistance. The silicon wafer may then be bonded to an oxidized substrate 162 and processed according to the previously described method. In this instance, however, the sinker diffusion 164 will out diffuse through silicide layer 158 and wrap around the silicide layer as shown at 166. Additionally, a second sinker diffusion region 168 enclosed by dotted line 170 may be performed.

Modifications and substitutions by those of ordinary skill in the art are considered to be within the scope of the present invention which is not to be limited except by the claims which follow.

I claim:

1. A method of processing at least two semiconductor wafers, for providing a semiconductor substrate adapted for being further processed to define one or more vertical, semiconductor elements, comprising the steps of:

forming a metal silicide layer on at least a portion of at least one generally planar surface of a first semiconductor wafer;

bonding said metal silicide layer and said first semiconductor wafer to an oxidized surface of a second semiconductor wafer, for forming a bonded semiconductor substrate; and after said step of bonding, further processing said semiconductor substrate to define in said first semiconductor wafer portion of said bonded semiconductor substrate, a plurality of vertical semiconductor elements, said step of further processing said bonded semiconductor substrate including at least the steps of:

introducing an impurity substance into said first semiconductor wafer;

diffusing said impurity substance vertically through said first semiconductor wafer into said metal silicide layer;

laterally diffusing said impurity substance into at least a portion of said metal silicide layer; and vertically up-diffusing said impurity substance from said metal silicide layer into a region of said first semiconductor wafer adjacent said portion of metal silicide layer into which has been laterally diffused said impurity substance.

2. The method of claim 1 wherein the step of further processing said semiconductor substrate includes the step of thinning the first wafer portion of said bonded semiconductor substrate to a desired thickness.

3. The method of claim 1 wherein the step of bonding said metal silicide layer to an oxidized surface of a second semiconductor wafer includes providing an intervening layer between said metal silicide layer and said oxidized surface.

4. The method of claim 3 wherein said intervening layer includes silicon.

5. The method of claim 4 wherein said silicon is a compound of one of silicon dioxide and silicon nitride.

6. The method of claim 1 further including after the step of bonding but prior to the step of further processing, the step of forming electrical isolation regions through both said first semiconductor wafer and said metal silicide layer, for forming electrically isolated semiconductor element regions.

7. The method of claim 6 further including after the step of forming electrical isolation regions, the step of:

introducing an impurity substance at least one of said semiconductor element regions; and diffusing said impurity substance into said at least one semiconductor element region, said diffusion extending generally uniformly through said at least one semiconductor element region from the surface of said first semiconductor wafer and contained within said at least one of said semiconductor element regions and excluding said metal silicide layer.

8. The method of claim 7 wherein said silicide layer includes one of tungsten silicide, molybdenum silicide, tantalum silicide and titanium silicide.

* * * * *